United States Patent
Beekman et al.

(10) Patent No.: US 6,242,366 B1
(45) Date of Patent: Jun. 5, 2001

(54) METHODS AND APPARATUS FOR TREATING A SEMICONDUCTOR SUBSTRATE

(75) Inventors: Knut Beekman; Adrian Kiermasz, both of Bristol; Simon McClatchie, Monmouthshire; Mark Philip Taylor; Peter Leslie Timms, both of Bristol, all of (GB)

(73) Assignee: Trikon Equipments Limited, Newport (GB)

( * ) Notice: Subject to any disclaimer, the term of this patent is extended or adjusted under 35 U.S.C. 154(b) by 0 days.

(21) Appl. No.: 09/251,157

(22) Filed: Feb. 17, 1999

Related U.S. Application Data

(63) Continuation-in-part of application No. PCT/GB97/02240, filed on Aug. 21, 1997.

(30) Foreign Application Priority Data

Aug. 24, 1996 (GB) .................................................. 9617793
Apr. 19, 1997 (GB) .................................................. 9707950

(51) Int. Cl.[7] .................................................. H01L 21/26
(52) U.S. Cl. ........................... 438/790; 438/781; 438/789
(58) Field of Search .................................. 438/780, 781, 438/787, 789, 790

(56) References Cited

U.S. PATENT DOCUMENTS

| | | | |
|---|---|---|---|
| 3,822,928 | 7/1974 | Smolinsky et al. | 385/130 |
| 4,096,315 | 6/1978 | Kubacki | 428/412 |
| 4,397,722 | 8/1983 | Haller | 204/165 |
| 4,781,942 | 11/1988 | Leyden et al. | 427/509 |
| 5,314,724 | 5/1994 | Tsukune et al. | 427/489 |
| 5,506,008 | 4/1996 | Klumpp et al. | 427/515 |
| 5,593,741 | * 1/1997 | Ikeda | 427/579 |
| 5,776,828 | * 7/1998 | Givens | 438/631 |
| 5,874,367 | * 2/1999 | Dobson | 438/787 |

FOREIGN PATENT DOCUMENTS

| | | |
|---|---|---|
| 0353 818 A1 | 2/1990 | (EP) . |
| 0 382 932 A2 | 8/1990 | (EP) . |
| 0 497 306 A2 | 8/1992 | (EP) . |
| 0 568 235 A1 | 11/1993 | (EP) . |
| 0 726 599 A2 | 8/1996 | (EP) . |
| 743675-A1 | 11/1996 | (EP) . |
| 2 125 423 | 3/1984 | (GB) . |
| 09008031 | * 1/1997 | (JP) . |
| WO 94/01885 | 1/1994 | (WO) . |
| WO 98/08249 | 2/1998 | (WO) . |

OTHER PUBLICATIONS

M. Matsuura et al., "Novel Self–planarizing CVD Oxide for Interlayer Dielectric Applications", 1994 IEEE, pp. 117–120.

Nikkei Microdevices, pp 105, Jul. 1995.

\* cited by examiner

Primary Examiner—Michael Trinh
Assistant Examiner—Jeff Vockrodt
(74) Attorney, Agent, or Firm—Jones Volentine, LLC

(57) ABSTRACT

A liquid short-chain polymer of the general formula $R_aSi(OH)_b$ or $(R)_aSiH_b(OH)_c$ is deposited on a substrate, where a+b=4 or a+b+c=4, respectively, a, b and c are integers, R is a carbon-containing group and a silicon to carbon bond is indicated by Fourier Transfer Infrared analysis. The short-chain polymer is then subjected to further polymerization to form an amorphous structure of the general formula $(R_xSiO_y)_n$, where x and y are integers, x+y=4, x≠0, n equals 1 to ∞, R is a carbon-containing group and a silicon to carbon bond is indicated by Fourier Transfer Infrared analysis.

20 Claims, 12 Drawing Sheets

Random

Random

METHODS AND APPARATUS FOR TREATING A SEMICONDUCTOR SUBSTRATE

CROSS REFERENCE TO RELATED APPLICATIONS

This application is a Continuation-In-Part of International Application No. PCT/GB97/02240, filed Aug. 21, 1997, the entirety of which is incorporated by reference herein for all purposes.

BACKGROUND OF THE INVENTION

This invention relates to methods and apparatus for treating a semiconductor substrate, such as a semi-conductor wafer, and, in particular, but not exclusively, to methods and apparatus for providing a low dielectric constant (known as low k) layer in a planarisation or gap filling operation.

In our earlier co-pending patent application WO94/01885, the contents of which are incorporated herein by reference, we describe a planarisation technique in which a liquid short-chain polymer is formed on a semiconductor wafer by reacting silane ($SiH_4$) with hydrogen peroxide ($H_2O_2$). The polymer, which initially is in a liquid state, is formed on to a wafer to produce planarisation either locally or globally, or gap filling. This technique provides a planarisation or gap filling layer of silicon dioxide and we have found it to be a most suitable material for semiconductor circuit manufacturing.

SUMMARY OF THE INVENTION

However, with the ever increasing demands to enhance device speed and reduce size, there can be problems in more advanced devices with using silicon dioxide as the dielectric insulator between metal lines. The RC time constant associated with the metal lines (or interconnects) on an integrated circuit structure limits the device speed and is a function of the resistance of the interconnections, the thickness of the insulator and its dielectric constant.

Thus in order to reduce the RC time constant and enhance device speed, the options are to modify the characteristics of the interconnect, or the insulator. There are many device design constraints, and practicalities which restrict the designer's freedom and thus we believe it is extremely important to reduce the dielectric constant of the insulator, whilst trying to retain the other desirable properties which make silicon dioxide a suitable material.

For advanced semiconductor devices, dielectric constant values of <3.5 are required and ideally are <3.0. We have found that it is possible to provide a dielectric layer which substantially retains the desirable properties of silicon dioxide but which has a significantly reduced dielectric constant, thereby making it suitable for use in advanced logic devices.

We have also found that the dielectric constant can be reduced by applying a particular set of process conditions.

Accordingly, in one aspect of this invention, there is provided a method of treating a semiconductor substrate, comprising forming on the substrate a liquid short-chain polymer of the general formula $R_aSi(OH)_b$ or $R_aSiH_b(OH)_c$ where a+b=4 or a+b+c=4 respectively; a, b and c are integers, R is a carbon-containing group and Si—C bonding is inferred.

The reference to the polymer being 'liquid' is simply intended to indicate that it is neither gaseous nor solidified at the moment of formation.

Preferably R is a methyl, ethyl, phenyl or vinyl group, with methyl ($CH_3$—) being particularly preferred.

The further polymerisation may be enhanced by heating. It is thought that the liquid short chain polymer undergoes further polymerisation reactions to form an amorphous structure of the general formula —($R_xSi\ O_y$)n—where x+y=4 x and y are integers
R is a carbon-containing group
n=1 to ∞
Si—C bonding is inferred In another aspect of this invention there is provided a method of treating a semiconductor substrate, which comprises positioning the substrate in a chamber;

introducing into the chamber in the gaseous or vapour state an organosilane containing compound with the general formula $C_xH_y$—$Si_nH_a$, and a further compound, containing peroxide bonding, and reacting the organosilane compound with said further compound to provide on said substrate a short-chain polymer.

According to this invention a liquid short-chain polymer layer is formed on the substrate, the polymer being carbon doped to reduce the dielectric constant of the formed layer. The layer is formed by reacting a silicon containing compound with a compound containing peroxide bonding, and the dopant material may be bound to or otherwise associated with one of the reactants, preferably to the silicon containing gas.

The term peroxide bonding includes hydroperoxide bonds such as O—OH.

Preferably said silicon-containing compound is of the general formula R—$SiH_3$; R may be a methyl, ethyl, phenyl or vinyl group with methyl ($CH_3$—) being particularly preferred. Si—C bonding is inferred. Preferably said silicon-containing compound and said further compound may react in a surface reaction on the surface of the substrate. Further polymerisation of the polymer may take place to form an amorphous structure of the general Formula —($R_xSiO_y$)$_n$ with the constraints set out above. Further polymerisation may be enhanced by radiative or chemical treatment e.g. by heating.

Preferably the dielectric constant, measured at 1 MHz, of said deposited material is less than 3.5 and more preferably less than 3.

The deposition rates may be enhanced by use of a weakly ionized plasma within the process chamber. However, this may be at the expense of Si—C bonding and thus the resultant dielectric constant of the deposited layer may be higher than if a plasma had not been used, but it will still be usefully lower than an un-doped silicon dioxide layer.

Thus, with some silicon-containing precursors, the use of a plasma enhances the deposition rate without significant detriment to the planarity of the deposited polymer.

The method may further comprise forming or depositing an under layer or base layer prior to the deposition of the polymer layer. The base layer is preferably deposited using a Chemical Vapour Deposition (CVD) or Plasma Enhanced Chemical Vapour Deposition process (PECVD) before the depositing of the polymer layer. The PECVD or CVD process is preferably carried out in a separate chamber to that in which the polymer layer is deposited, but can be carried out in the same chamber. The under layer may be a doped or un-doped silicon dioxide or other silicon containing layer.

The method may further comprise depositing or forming a capping layer on the surface of the formed layer. This layer is preferably applied in a PECVD process.

Preferably said PECVD or CVD capping process is applied in a chamber separate to that in which the polymer layer is formed. The capping layer may be a doped or un-doped silicon dioxide or other silicon containing layer.

Preferably the PECVD or CVD chamber comprises a platen for supporting the substrate which is maintained at a temperature in the range of from 100° C.–450° C., and more preferably around 350° C.

The method may further comprise chemical or radiative treatment (e.g. heating) of the polymer layer and this heating preferably takes place after capping, as the cap provides mechanical stability for the polymer layer during cross-linking. The polymer layer may be heated to 350° C.–470° C. for 10 to 60 minutes. For example the heating may last 30 minutes at 400° C. The heating may be achieved using a furnace, heat lamps, a hot plate, or plasma heating. The heat treatment step removes excess water from the layer, which is a by-product of the cross-linking reaction. It may also remove SiOH bonds.

In another aspect, the invention provides a method of treating a semiconductor substrate, which comprises positioning the substrate into a chamber, introducing into the chamber in the gaseous or vapour state an organosilane compound of the general formula $(C_xH_y)_zSi_nH_a$, and a further compound containing peroxide bonding and reacting the silicon-containing compound with said further compound.

In another aspect, this invention provides apparatus for implementing the method as described above which comprises a CVD chamber and PECVD chamber, said CVD chamber having means for introducing therein two or more reaction gases or vapours, platen means for supporting a semiconductor substrate, and means for maintaining the temperature of the platen at a required level, said PECVD or CVD chamber including platen means for supporting a semiconductor substrate, means for introducing one or more reaction gases or vapours, together with means for generating a plasma if required, to cause the gaseous vapours to react.

BRIEF DESCRIPTION OF THE DRAWINGS

The invention may be performed in various ways and a specific embodiment will now be described, by way of example, with reference to the following drawings, in which.

DETAILED DESCRIPTION OF THE PREFERRED EMBODIMENTS

Figure 1:
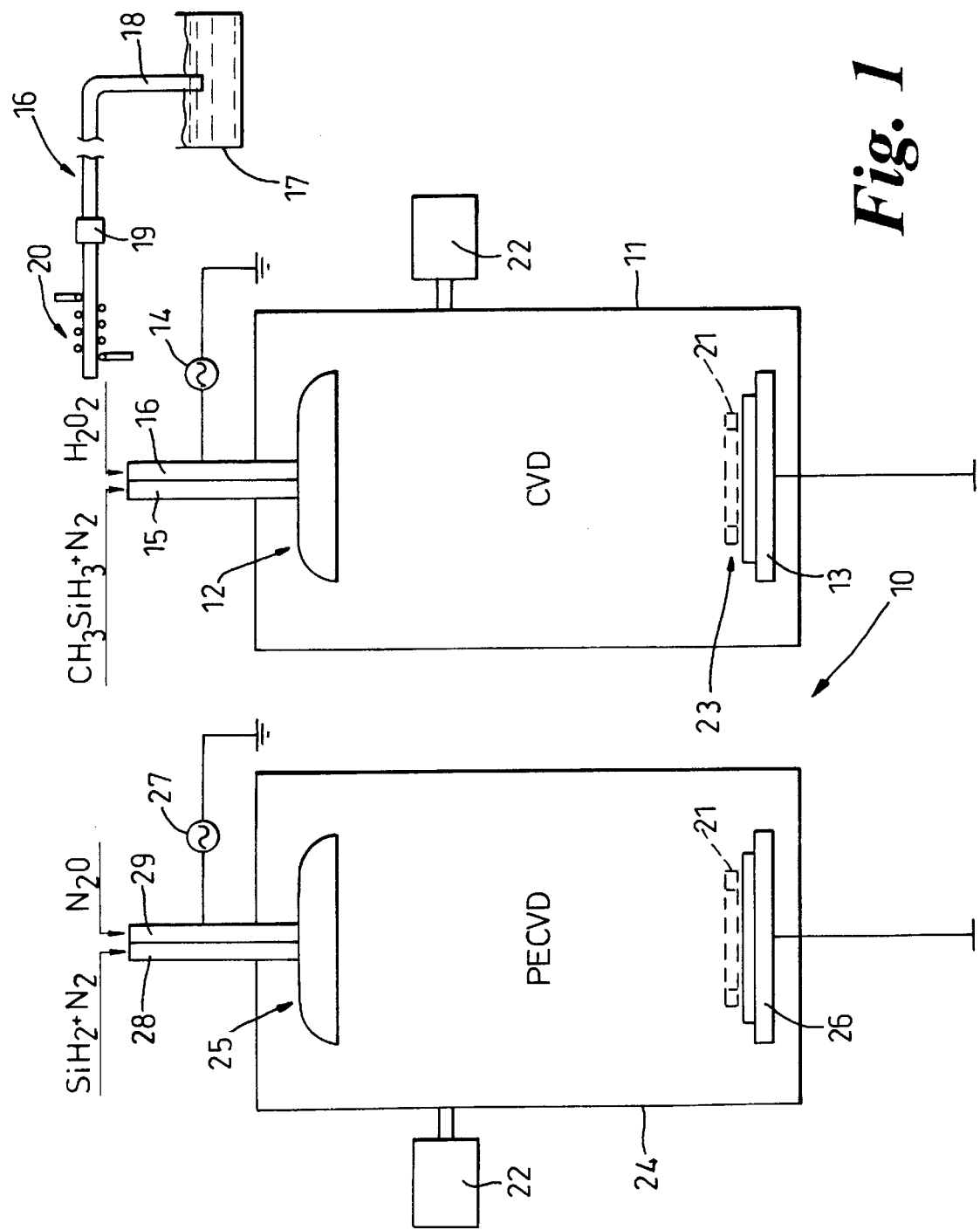
FIG. 1 is a schematic view of apparatus for performing the treatment method.

Apparatus for treating semiconductor substrates, such as semi-conductor wafers is schematically illustrated at 10 in FIG. 1. It will be understood that only the features which are particularly required for the understanding of the invention are described and illustrated. The general construction of such apparatus is well known in the art.

Thus, the apparatus 10 includes a chemical vapour deposition (CVD) chamber 11 having a duplex shower head 12 and a substrate support 13. The shower head 12 is connected to RF source 14 to form one electrode, whilst the support 13 may be earthed and may form another electrode. (The RF source 14 is provided to allow etch back of the chamber and chamber furniture for cleaning purposes and/or to provide a weakly ionised plasma during deposition). The shower head 12 is connected by respective pipes 15 and 16 to a source of $CH_3SiH_3$ in $N_2$ or other inert carrier and a source of $H_2O_2$. The carrier gas is conveniently used for ease of operation of the equipment; it is believed that the process could be performed without it. The source of $H_2O_2$ comprises a reservoir 17, an outlet pipe 18, a pump 19 and a flash heater 20 for vaporising the $H_2O_2$.

In use the CVD chamber may be operated to form a short chain, inorganic polymer, which is initially a liquid, on the surface of a semi-conductor wafer to produce planarisation either locally or globally, or for 'gap filling'. The polymer is formed by introducing into the chamber the methyl silane and the hydrogen peroxide in vapour form and reacting them either in a gaseous reaction or at the wafer surface spontaneously. Once the resultant polymer is formed on the wafer, it has been found that the rate of polymerisation is such that the condensate remains a liquid long enough to allow the polymer to flow. As a consequence the layer fills both small and large geometries or gaps. As the film grows thicker; surface tension tends to cause the film to self planerise. It is believed that effectively this process takes place as the polymerisation takes place. The more settlement which occurs prior to full polymerisation the less likelihood there is of cracking. Very small dimensioned gaps can be filled and because of the fill layer properties these gaps can even, in certain circumstances, be re-entrant.

It has further been found that providing a weakly ionized plasma in the chamber enhances deposition rates, without being significantly detrimental to the properties of the layer. Thus, with some silicon containing precursors, the use of a plasma enhances the deposition rate without significant detriment to the planarity of the deposited polymer.

The apparatus 10 also includes a Plasma Enhanced Chemical Vapour Deposition (PECVD) chamber 24 of generally conventional construction, comprising a shower head 25 and a wafer support 26. The shower head 25 is connected to RF source 27 to form one electrode, whilst the support 26 is earthed either directly on through a variable resistance and forms another electrode. Alternatively the shower head 25 may be earthed and the support may be driven. The shower head 25 is connected by respective pipes 28 and 29 to a source of silane ($SiH_4$) in $N_2$ or other inert carrier and a source of $N_2O$ In use, the PECVD chamber may be operated to deposit a base layer or under layer on a semiconductor wafer or other semiconductor substrate prior to deposition of the doped polymer layer discussed above. Likewise, after deposition of the polymer layer in the CVD chamber 11, the semiconductor wafer may be returned to the PECVD chamber for plasma deposition of a capping layer. Both the under layer or base layer and the capping layer have a similar chemistry of silicon dioxide.

A pump 22 is provided for reducing chamber pressure.

EXAMPLE

A wafer is loaded into the machine and transferred to the PECVD chamber. A 1000 Å base layer of silicon dioxide is deposited at a temperature of 350° C. (The base layer could be between 100 Å and 3000 Å thick). Whilst still in the PECVD chamber, the wafer may be subjected to pre-treatment with a plasma, for example using a gas such as $N_2O$, $O_2$ or $N_2O$. The wafer is then transferred to the CVD chamber 11 where the polymer layer is formed at a platen temperature of 0° C., to a thickness of 8000 Å. The pressure in the CVD chamber 11 during formation of the polymer layer is typically around 850 mT. For good quality films and to reduce the dielectric constant, it is desirable to remove as much water and OH from the film at an early stage. The layer is therefore exposed to a reduced pressure (typical 1–2 mT) for a period of thirty seconds.

The wafer is then transferred to the PECVD chamber and a capping layer of 1000 Å–6000 Å is deposited at a temperature of 350° C. The wafer is then unloaded from the machine and furnace heat treated at a temperature of 400° C. for thirty minutes to remove the residual moisture and OH from the film, the inclusion of which would cause the dielectric constant to be higher.

Where the PECVD and CVD process are to be carried out in the same chamber, a wafer loading device 21 can be used to lift the wafer to an intermediate position 23 during heating of the wafer, to avoid unnecessary heating of the support 13.

EXPERIMENT

Figure 7:
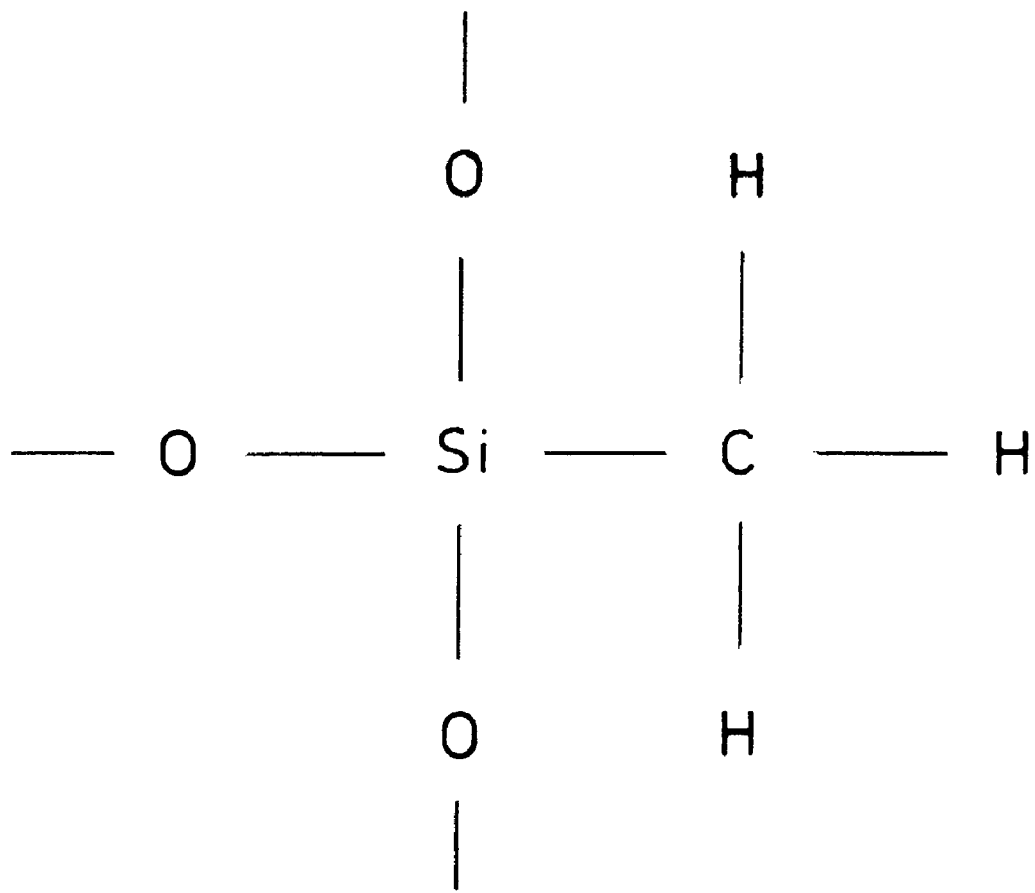
FIG. 7 is a diagram of a chemical structure referred to below.

Analysis of the basic chemistry involved suggested that the Si—H bonds in the $SiH_3$ component of $CH_3$—$SiH_3$ would react with $H_2O_2$ in a similar manner to the Si—H bonds in $SiH_4$, leaving the Si—$CH_3$ bond intact. The resultant film was therefore expected to contain a basic $SiO_2$ structure with a $CH_3$ group attached to each silicon atom. An example of such a structure is shown in FIG. 7.

Initial observations confirmed that the doped polymer layer was indeed formed using the new process. The resultant film was then evaluated to confirm that Si—$CH_3$ was present in the film.

Figure 2:
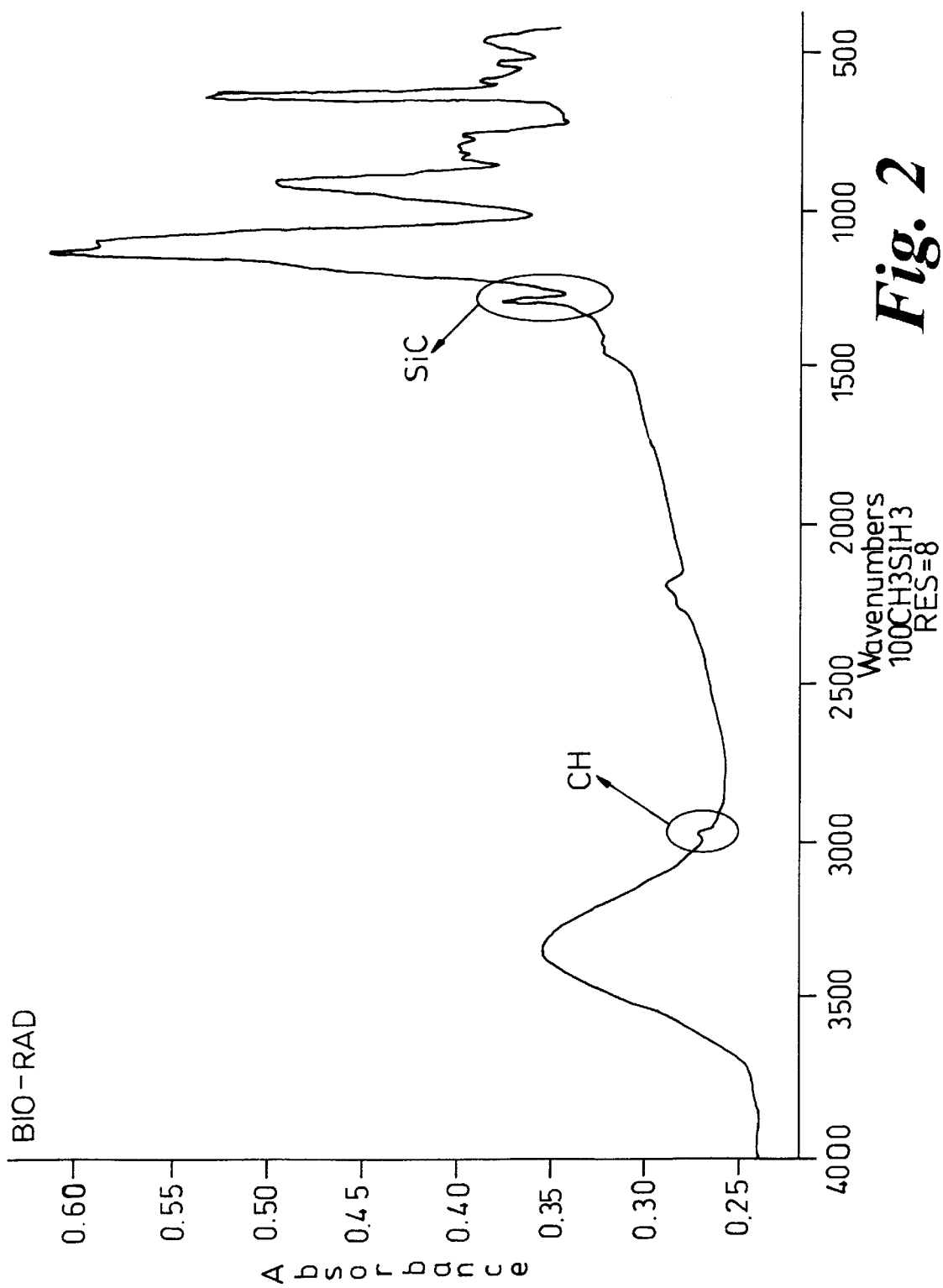
FIG. 2 is a FTIR analysis of an example of a polymer layer of this invention.

In order to confirm that Si—$CH_3$ and C—H bonds were present in the layer, we subjected the layer to Fourier Transform Infra-red (FTIR) analysis and the results are shown in FIG. 2, which indicate that both the C—H and Si—C bonds are present.

Figure 3:
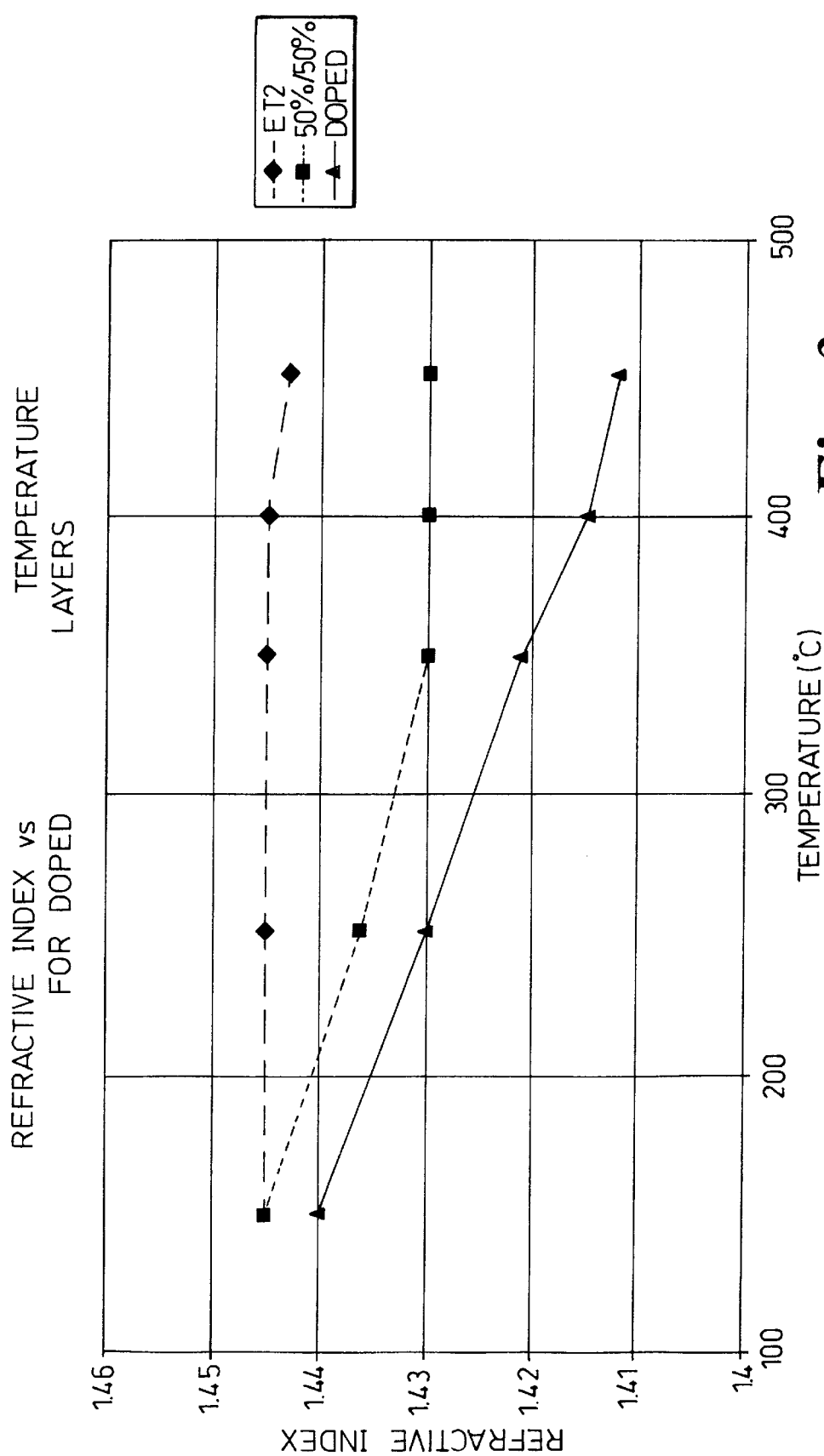
FIG. 3 is a graph showing variation of refractive index with heating temperature for a polymer layer in accordance with this invention and two comparative layers.

It is known that the refractive index of a material is related to the dielectric constant. Refractive index measurements confirmed a lower refractive index was obtained for the doped polymer layer following thirty minute furnace heat treating in nitrogen ambient. As discussed above, the heat treating removes residual moisture from the layer. In FIG. 3 the results are plotted, for increasing heating temperature, for a polymer layer of this invention "DOPED", for a silane/hydrogen peroxide layer as described in WO94/01885 "ET2" and a hybrid of these two layers "50%/50%". A marked decrease in refractive index was observed for the doped polymer layer in comparison with the layer according to WO94/01885. The hybrid (50%/50%) layer showed a smaller reduction in refractive index which was consistent given the smaller proportion of methyl silane in the source gas.

Figure 4:
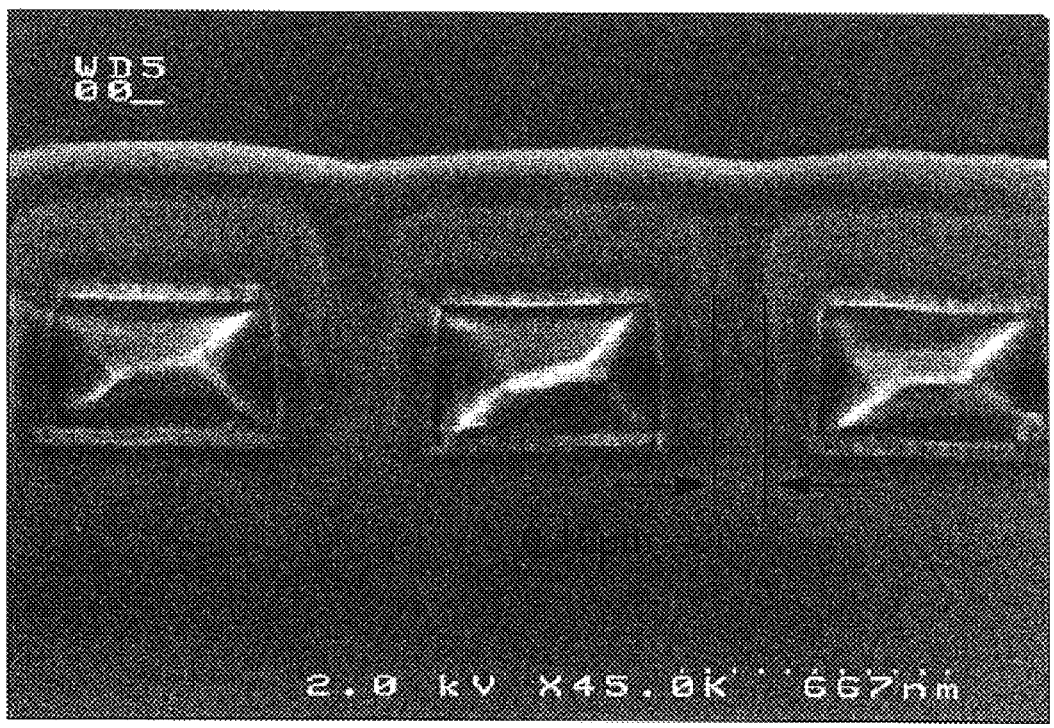
FIG. 4 is a Scanning Electron Micrograph showing the flow property of the polymer layer of this invention.

Scanning Electron Microscope (SEM) observation confirmed that the polymer layer exhibited good flow properties, as seen in the SEM views given in FIG. 4.

Dielectric constant measurements were taken over an average of five wafers produced in accordance with the above example, with 25 capacitors per wafer. The wafers were furnace heat treated prior to measurement at a temperature of 400° C. in nitrogen for thirty minutes. The doped polymer layer averaged a dielectric constant of 3.24 at 1 MHz.

Figure 5:
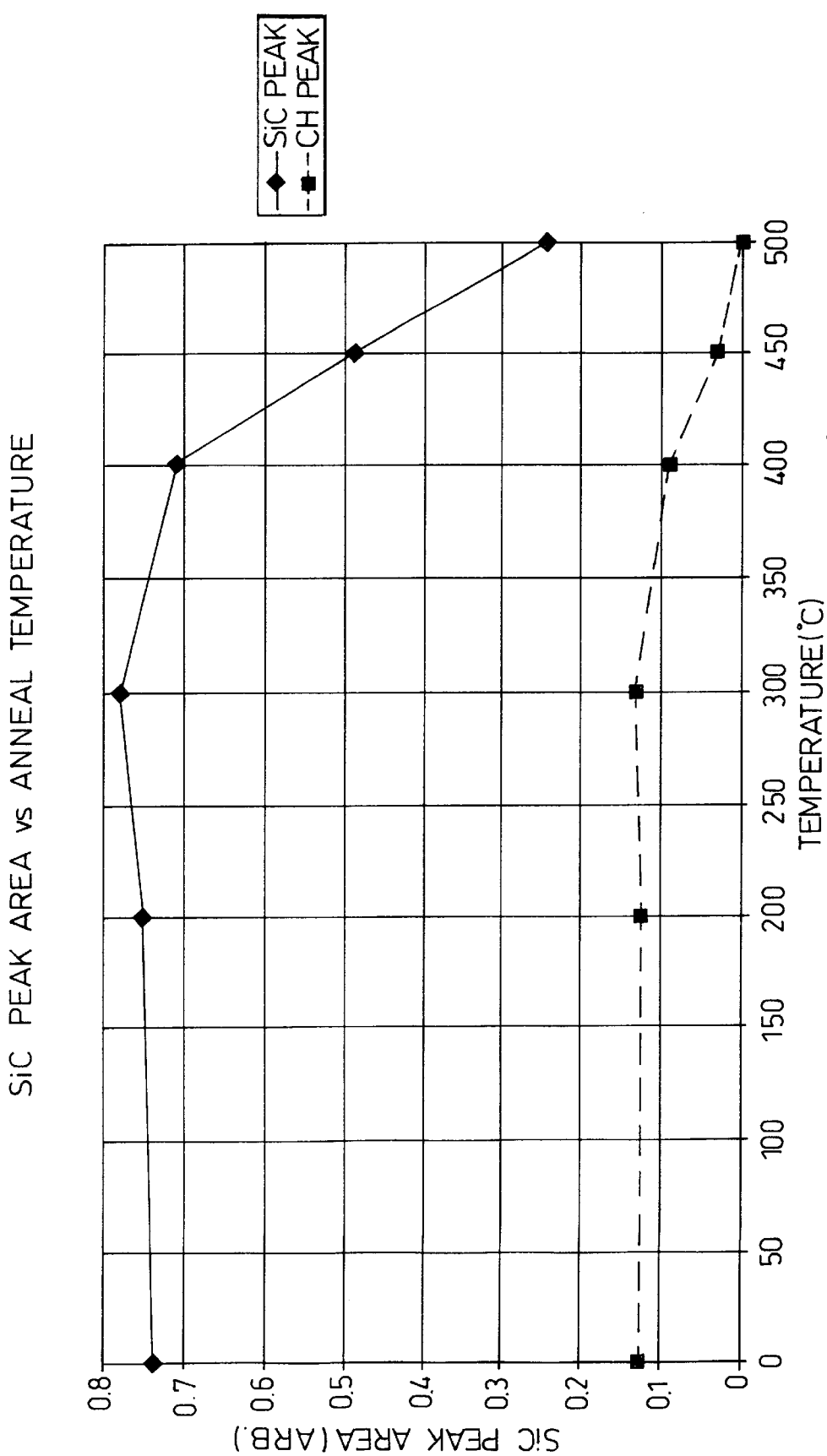
FIG. 5 is a graph of integrated Si—C and C—H peak areas versus heating temperature for a polymer layer an embodiment of this invention.
Figure 6:
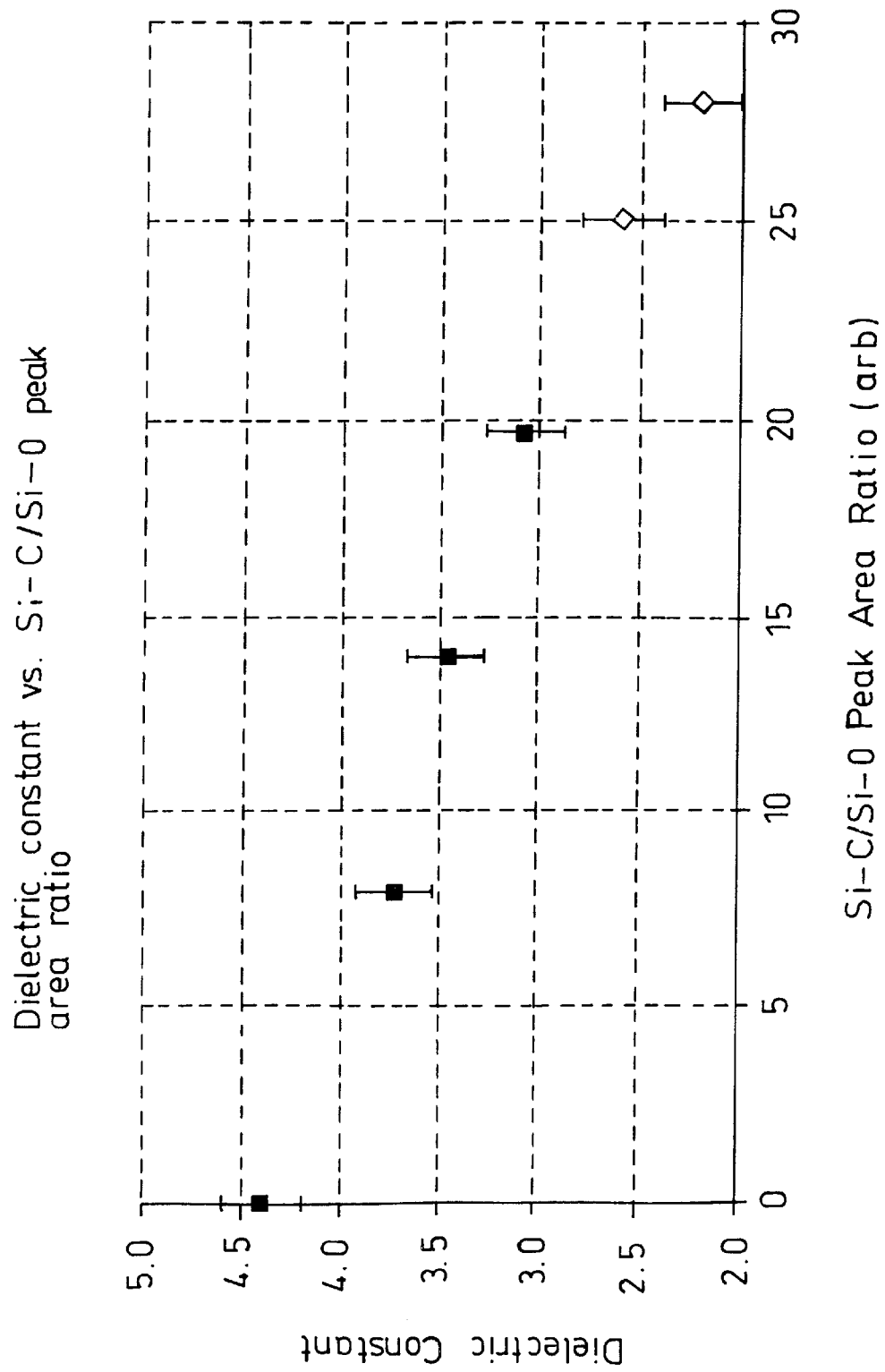
FIG. 6 is a graph of dielectric constant versus Si—C/Si—O peak area ratio for the polymer layer in accordance with this invention.

An important property of any doped oxide layer is its temperature stability. Theory suggests that the Si—C bond should be generally stable to temperatures up to about 400° C., and we had predicted that the same would be true for Si—C bonds within the doped polymer layer. To confirm the temperature stability of the doped polymer layer, a wafer was furnace heat treated in nitrogen ambient at sequentially higher temperatures whilst monitoring both the Si—C and C—H peaks using FTIR. FIG. 5 shows a plot of the integrated Si—C and C—H peak areas versus heating temperature. The curves indicate that the Si—C and C—H bonds are stable within the hardened doped polymer layer up to temperatures of at least 400° C. after which the areas of the peaks and hence the number of bonds are seen to reduce.

As has been indicated above the methyl silane may be substituted by ethyl, phenyl, vinyl silane or other organic silane and sources of peroxide bonding other than hydrogen peroxide may be used. Further precursors could be employed that provide an Si—C bond that was maintained from the gaseous phase adjacent to the wafer to the resultant hardened polymeric layer upon the semiconductor substrate.

When forming films from the reaction of hydrogen peroxide with hydrocarbon and silicon containing gases and in particular methyl e.g. methyl silane or dimethyl silane containing gases it has been discovered that a lower density film is formed than films formed under similar conditions by the reaction of silane and hydrogen peroxide. Some of these reactions will take place at suitable temperatures and pressures without any additional energy input to yield useful semiconductor dielectric layers. Other source materials may require energy input in the form of RF or microwave plasma or thermal energy. Thus, an organosilane of general formula $(C_xH_y)_zSi_nH_a$ can be used in the invention, where x, y, z, n, and a are any suitable integers.

The absence of a plasma or heating may usefully slow or modify the thin film formation process to enable flowing liquid intermediate states that have gap filling characteristics.

Where gap filling is not required a wider choice of source materials and process conditions is possible to include those materials or process conditions requiring a plasma or heating to be used.

Figure 8:
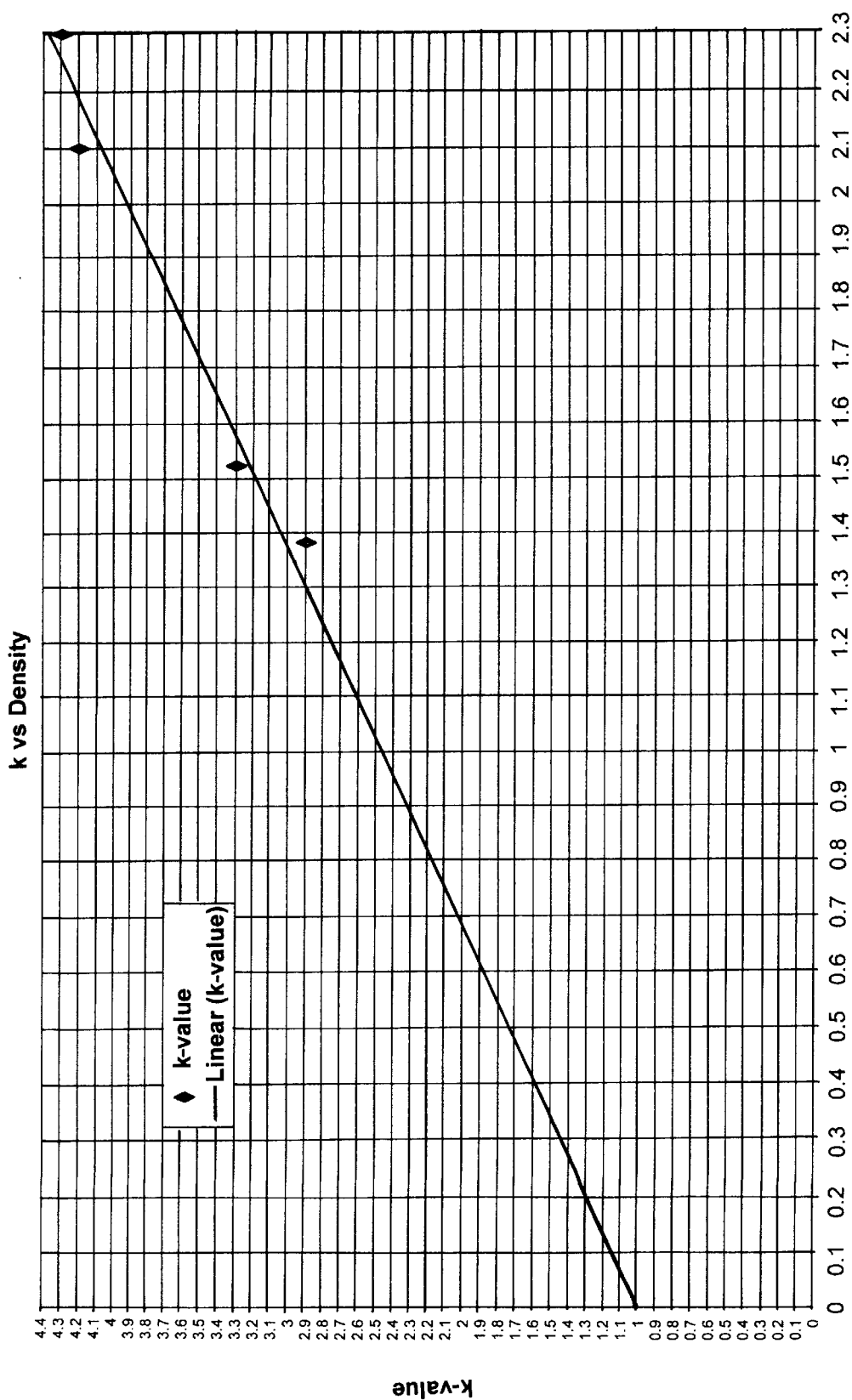
FIG. 8 is a graph showing k values against density.

Typically a film formed from the reaction of silane and hydrogen peroxide results in a film of density 2.2 g/cc when fully hardened. Films have been formed from the reaction of methyl silane and hydrogen peroxide with densities of 1.39 g/cc and 1.53 g/cc and other similar values. These lower density films have also been noted to have lower k values and the k values correlate linearly to the density as shown in FIG. 8.

Low k values are particularly useful for the production of insulators in semiconductor devices. By reducing the k value of the dielectric film the RC time delay in metal conductors is reduced without increasing line spacing thus allowing faster transmission of data along the conductors.

It has been discovered that the carbon and in particular the hydrocarbon in the source material is also contained within the deposited film. The FTIR spectra (FIG. 2) of a fully formed film deposited from methyl silane and hydrogen peroxide shows a characteristic peak associated with silicon-carbon bonds as well as the presence of carbon-hydrogen bonding.

Figure 9:
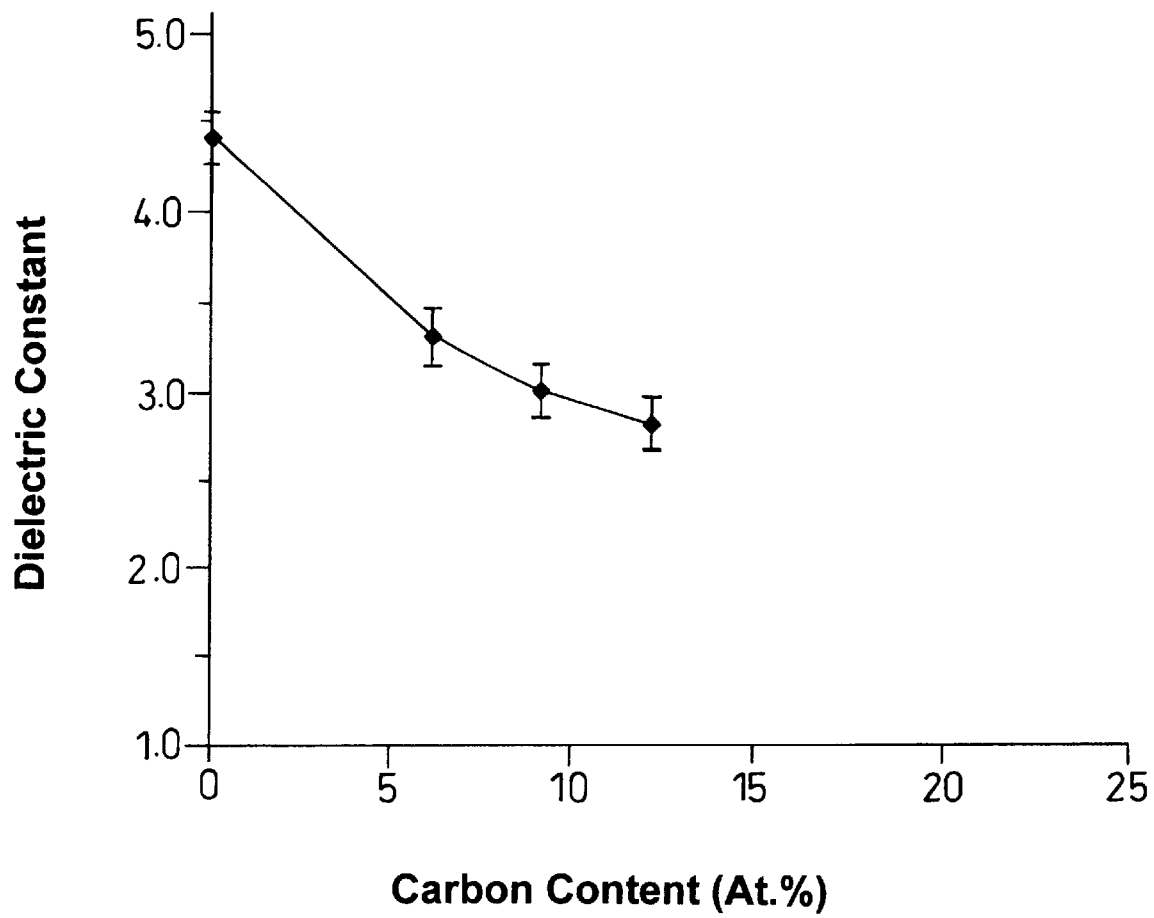
FIG. 9 is a graph showing correlation between carbon content and dielectric constant.

It has also been discovered that there is a close correlation between carbon content and k value. The higher the carbon content (over a useful range) the lower the k value. The correlation between carbon content and k (dielectric constant) is shown in FIG. 9. This chart was plotted using Rutherford BackScattering (RBS) to measure carbon content. So far attempts to obtain useable semiconductor dielectric layers with more than approximately 12 at. % of carbon from a spontaneous reaction of methyl silane and hydrogen peroxide have been unsuccessful. Problems have included "haze" in the film and whilst the film might be electrically and mechanically useful its visual appearance is such that such a film would probably be rejected by potential users.

It is now supposed that the empirical formula of the completely formed thin film is predominately $CH_3SiO_{3/2}$ where the methyl ($CH_3$) is contained within the Si—O by carbon bonding to silicon. There will however be some residual Si—H bonds.

Figure 10:
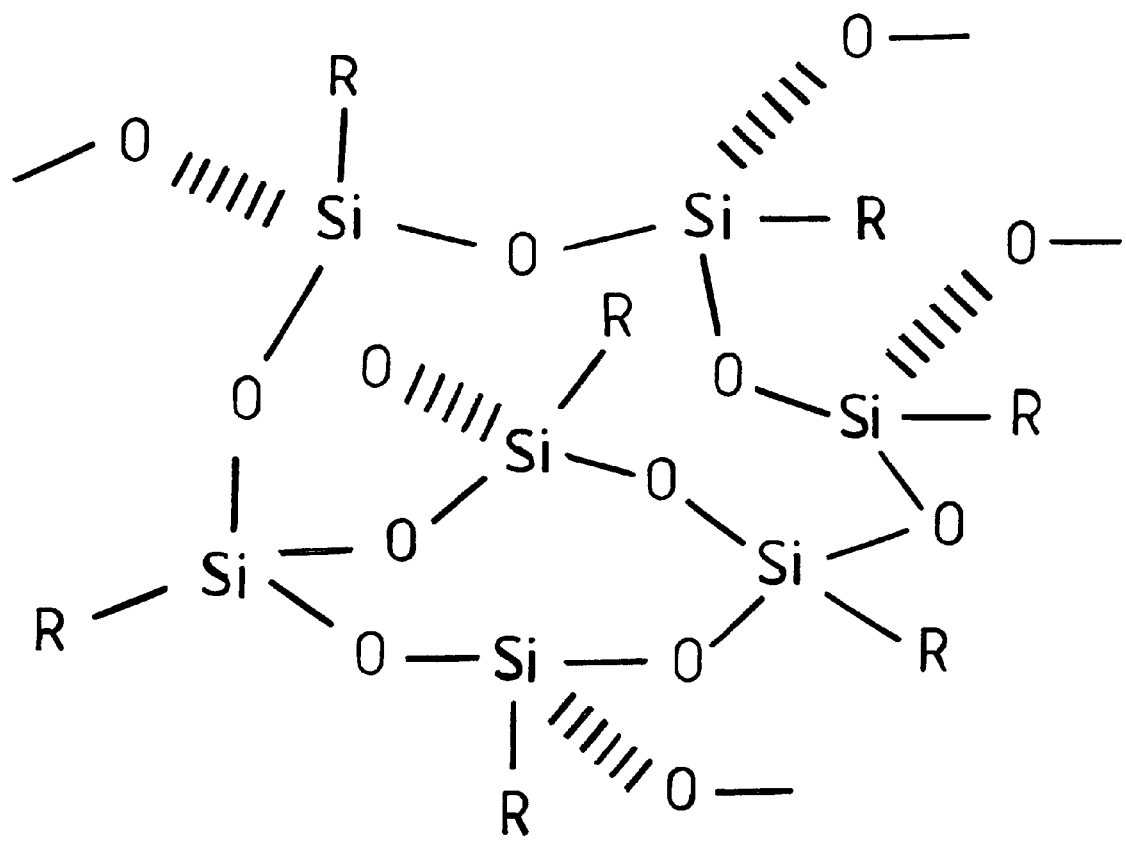
FIG. 10 is a diagram of a chemical structure referred to below.

What is not as yet fully understood is why this correlation between carbon content and k value occurs. What is now supposed is that methyl ($CH_3$) in the source material remains attached in some way to silicon and is contained within the fully hardened film in such a way as to suppress further cross linking within the film during its formation and/or solidification. Thus the presence of methyl suppresses a regularly ordered silicon dioxide polymeric film perhaps forming a cyclorandom polymeric structure. This disordering of the silicon dioxide polymer results in lower density films and thus a low k value. A diagrammatic representation of the fully hardened polymer film is given in FIG. 10 where R=predominately $CH_3$ with some H. There may also be ladder like structures present in the fully hardened polymeric film again with further crosslinking terminated by methyl.

Figure 11:
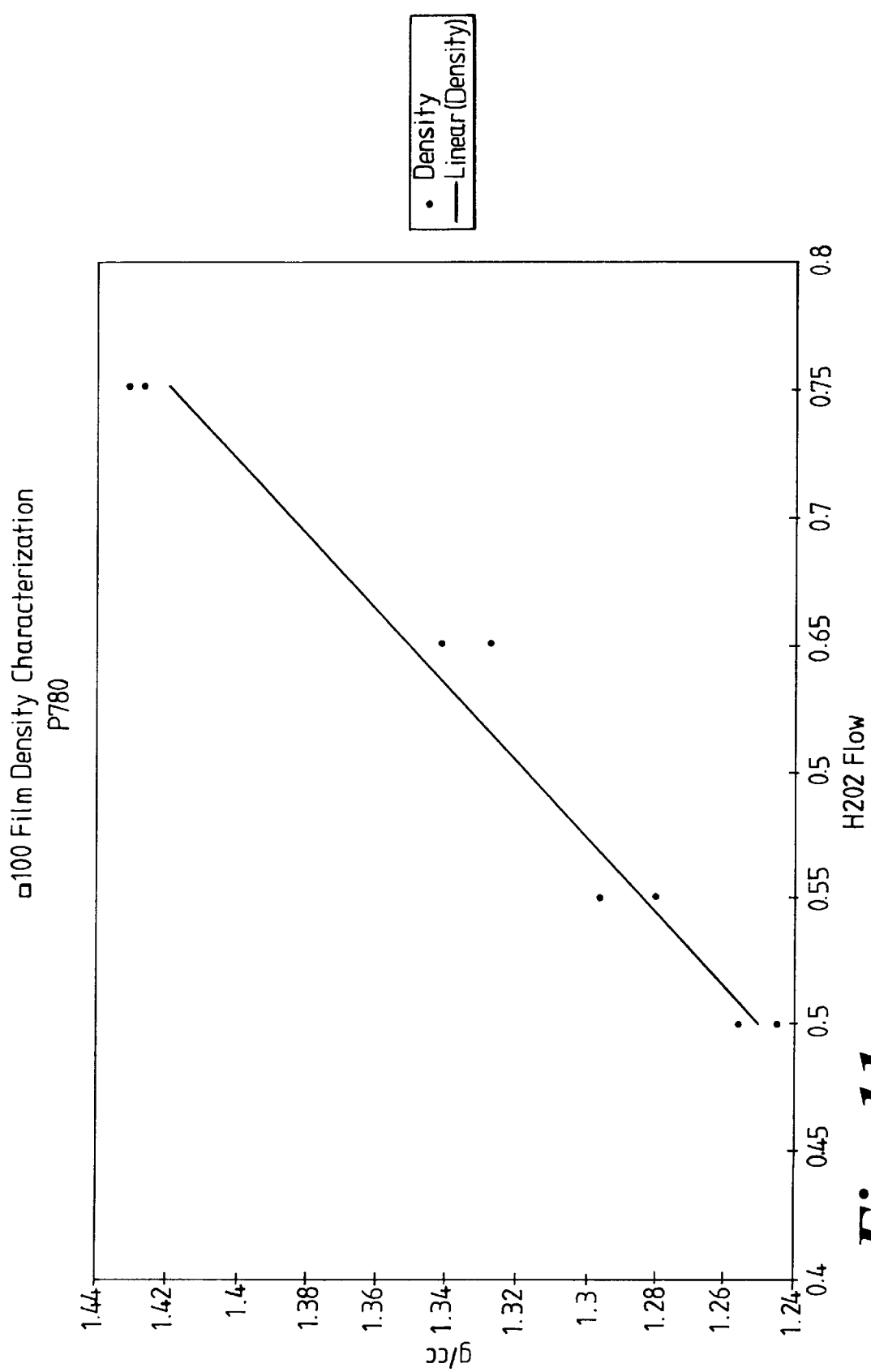
FIG. 11 is a graph showing density vs. peroxide flow correlation.

Evidence for this supposition is in density vs. peroxide flow correlation that is evident in FIG. 11. With a fixed flow rate of 87 sccm of methyl silane various different peroxide flows were experimented with. Thus the ratio of methyl in the total source material was varied. By weighing and measuring the volume of a semiconductor wafer before and after deposition the density of the finally hardened deposited film was calculated. It was found that as the carbon containing methyl proportion of the source material was increased the density of the fully formed deposited film decreased and the k value also decreased.

Figure 12:
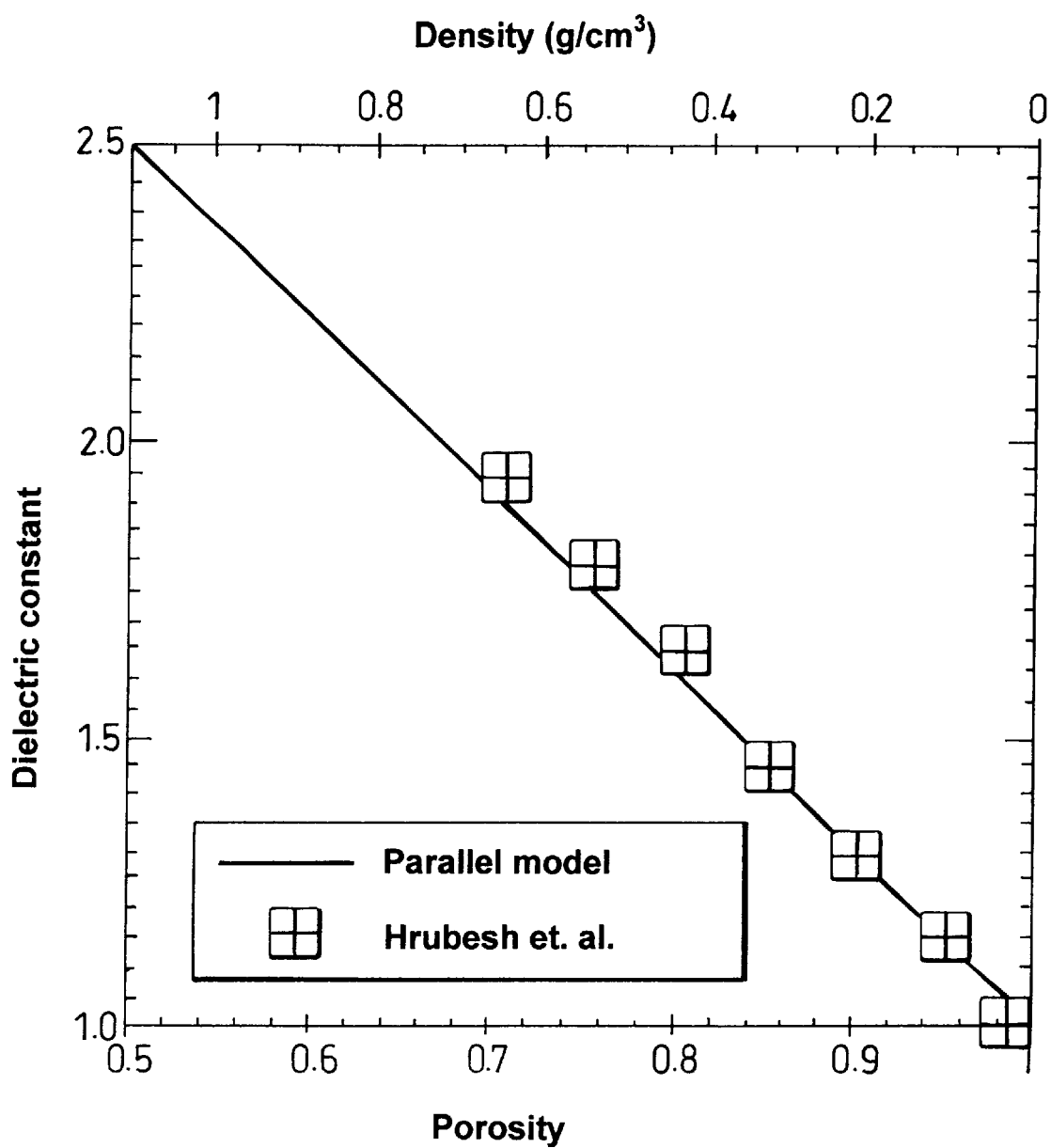
FIG. 12 is a graph showing dielectric constant vs. porosity.

It is thought that the fully formed material by this process has voids substantially only at a molecular level and is not characterised as nanoporous in the sense of an aerogel or xerogel structure where the completed film is typically half the density of a fully formed film (see FIG. 12 appears as FIG. 1 in Nanoporous Silica for low k dielectrics, Teresa Ramos et al Mat. Res. Soc. Symp, Proc. Vol 443 1997). Thus the process is not characterised by a gelation where there is formation of a gel intermediate. Microscopy of the fully formed film by this invention supports this view as the material appears to be a dense polymeric film; the reduction in density coming from the disordered linking of molecules due to lattice disruption caused by the hydrocarbon presence in the film.

These low k films had the following desirable characteristics; stable up to 480° C., low outgassing, low moisture uptake, capable of self planarisation, chemical and thermal stability and a resistance to cracking when annealed at 450° C. for 30 minutes.

Thus a film of a density of between 2.2 g/cc and 1 g/cc and more particularly between 1.5 g/cc and 1 g/cc may be produced by the reaction of a methyl containing silicon containing gas with a peroxide containing vapour resulting in a k value of less than 3.0 and more particularly approximately 2.5 to 3.0.

What is claimed is:

1. A method of treating a semiconductor substrate, comprising:

depositing on the substrate a liquid short-chain polymer of the general formula $R_aS(OH)_b$ or $(R)_aSiH_b(OH)_c$, where a+b=4 or a+b+c=4, respectively, a, b and c are integers, R is a carbon-containing group and a silicon to carbon bond is indicated by Fourier Transfer Infrared analysis; and subjecting the short-chain polymer to further polymerization to form an amorphous structure of the general formula $(R_xSiO_y)_n$, where x and y are integers, x+y=4, x≠0, n equals 1 to ∞, R is a carbon-containing group and a silicon to carbon bond is indicated by Fourier Transfer Infrared analysis.

2. A method according to claim 1, wherein R comprises a methyl, ethyl, phenyl or vinyl group.

3. A method as claimed in claim 1, wherein the deposited short-chain polymer contains 12at. % or less of carbon.

4. A method as claimed in claim 1, wherein the density of the deposited short-chain polymer is between 2.2 g/cc and 1 g/cc.

5. A method as claimed in 1, wherein the density of the deposited short-chain polymer is between 1.5 g/cc and 1 g/cc.

6. A method as claimed in claim 1, wherein the dielectric constant of said deposited short-chain polymer measured at 1 MHz is less than 3.5.

7. A method as claimed in 6, wherein the dielectric constant is less than 3.0.

8. A method as claimed in 6, wherein the dielectric constant is between 2.5 and 3.0.

9. A method as claimed in claim 1, wherein the deposition rate is enhanced by using a weakly ionised plasma.

10. A method as claimed in claim 1, further comprising forming or depositing an under layer or a base layer.

11. A method as claimed in claim 1, further comprising depositing or forming a capping layer on the surface of the amorphous structure.

12. A method as claimed in claim 1, further comprising chemical or radiative treatment of the polymer layer to provide mechanical stability of the layer.

13. A method of treating a semiconductor substrate, comprising:

positioning the substrate into a chamber;

introducing into the chamber in the gaseous or vapour state an organosilane compound of the general formula $C_xH_y$—$Si_nH_a$, and a further compound containing peroxide bonding, where a, x and y are integers, x≠0, and n equals 1 to ∞;

reacting the silicon-containing compound with the further compound to provide on the substrate a short-chain polymer;

subjecting the short-chain polymer to further polymerization to form an amorphous structure of the general formula $(R_xSiO_y)_n$, where a, x and y are integers $x \neq 0$, x+y=4, and n equals 1 to $\infty$, R is a carbon-containing group and a silicon to carbon bond is indicated by Fourier Transfer Infrared analysis.

14. A method according to claim 13, wherein said silicon-containing compound is of the general formula $C_xH_y$—$SiH_3$.

15. A method according to claim 14, wherein $C_xH_y$ is a methyl, ethyl, phenyl or vinyl group.

16. A method according to claim 14, wherein said silicon-containing compound is methyl silane ($CH_3SiH_3$).

17. A method of treating a semiconductor substrate, comprising:

positioning the substrate into a chamber;

introducing into the chamber in the gaseous or vapour state an organosilane compound of the general formula $C_xH_y$—$Si_nH_a$, and a further compound containing peroxide bonding, where a, x and y are integers, $x \neq 0$, and n equals 1 to $\infty$;

reacting the silicon-containing compound with the further compound to provide a resultant on the substrate; and subjecting the resultant to polymerization to form an amorphous structure of the general formula $(R_xSiO_y)_n$, where a, x and y are integers, $x \neq 0$, x+y=4, n equals 1 to $\infty$, R is a carbon-containing group, and a silicon to carbon bond is indicated by Fourier Transfer Infrared analysis.

18. A method according to claim 17, wherein a short-chain polymer is provided on said substrate.

19. A method according to claim 17 or 18, wherein the organosilane compound is dimethylsilane.

20. A method according to of claim 18, wherein said short-chain polymer is formed as a surface reaction.

* * * * *

UNITED STATES PATENT AND TRADEMARK OFFICE
CERTIFICATE OF CORRECTION

PATENT NO. : 6,242,366 B1
DATED : June 4, 2001
INVENTOR(S) : Knuet Beekman et al.

It is certified that error appears in the above-identified patent and that said Letters Patent is hereby corrected as shown below:

Column 8,
Line 19, change "$R_aS(OH)_b$" to -- $R_aSi(OH)_b$ --.

Signed and Sealed this

Seventh Day of June, 2005

JON W. DUDAS
*Director of the United States Patent and Trademark Office*